(12) United States Patent
Goel et al.

(10) Patent No.: US 8,704,582 B2
(45) Date of Patent: Apr. 22, 2014

(54) HIGH LINEARITY MIXER USING A 33% DUTY CYCLE CLOCK FOR UNWANTED HARMONIC SUPPRESSION

(71) Applicant: MediaTek Singapore Pte. Ltd., Singapore (SG)

(72) Inventors: Ankush Goel, Chandigarh (IN); Neric Fong, Santa Clara, CA (US)

(73) Assignee: Mediatek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/653,305

(22) Filed: Oct. 16, 2012

(65) Prior Publication Data

US 2013/0257508 A1 Oct. 3, 2013

Related U.S. Application Data

(60) Provisional application No. 61/617,726, filed on Mar. 30, 2012.

(51) Int. Cl.
*G06F 7/44* (2006.01)

(52) U.S. Cl.
USPC ............................. 327/356; 455/323; 455/326

(58) Field of Classification Search
USPC ............................ 327/351–361; 455/323, 326
See application file for complete search history.

(56) References Cited

U.S. PATENT DOCUMENTS

| | | | |
|---|---|---|---|
| 6,510,185 B2 | 1/2003 | Lee et al. | |
| 7,130,604 B1 | 10/2006 | Wong et al. | |
| 7,519,348 B2 | 4/2009 | Shah | |
| 7,986,192 B2 * | 7/2011 | Lee et al. | 331/37 |
| 2009/0004993 A1 | 1/2009 | Rafi et al. | |
| 2009/0004994 A1 | 1/2009 | Rafi et al. | |
| 2009/0325510 A1 | 12/2009 | Pullela et al. | |
| 2010/0130155 A1 | 5/2010 | Khoini-Poorfard et al. | |
| 2010/0233987 A1 | 9/2010 | Rafi et al. | |
| 2010/0240335 A1 | 9/2010 | Rafi et al. | |
| 2010/0328546 A1 | 12/2010 | Rafi et al. | |
| 2011/0065411 A1 | 3/2011 | Rafi et al. | |
| 2011/0201289 A1 | 8/2011 | Rafi et al. | |
| 2011/0244820 A1 | 10/2011 | Khoini-Poorfard et al. | |
| 2012/0322398 A1* | 12/2012 | Pullela et al. | 455/302 |

OTHER PUBLICATIONS

Jeffrey A. Weldon, et al., "A 1.75-GHz Highly Integrated Narrow-Band CMOS Transmitter With Harmonic-Rejection Mixers," IEEE Journal of Solid-State Circuits, vol. 36, No. 12, Dec. 2001, pp. 2003-2015.

Aslam A. Rafi, et al., "A Harmonic Rejection Mixer Robust to RF Device Mismatches," ISSCC 2011 / Session 3 / RF Techniques / 3.8, 2011 IEEE International Solid-State Circuits Conference, Feb. 21, 2011, 3 pages.

* cited by examiner

*Primary Examiner* — Dinh T. Le
(74) *Attorney, Agent, or Firm* — Saywer Law Group, P.C.

(57) ABSTRACT

A mixer circuit is disclosed. The mixer circuit comprises a plurality of mixer elements, wherein there are non-overlapping clock signals provided to the plurality of mixer elements which have a duty cycle of 33⅓ percent. Outputs signals of the mixer elements do not contain third order harmonic content of the non-overlapping clock signals. The third-order harmonic of the mixer is eliminated by using mixer which uses voltage sampling on non-overlapping clocks and thereby achieves high linearity. The mixer circuit is further expanded to remove the I-Q image and even order harmonics.

15 Claims, 13 Drawing Sheets

300

*Prior Art*

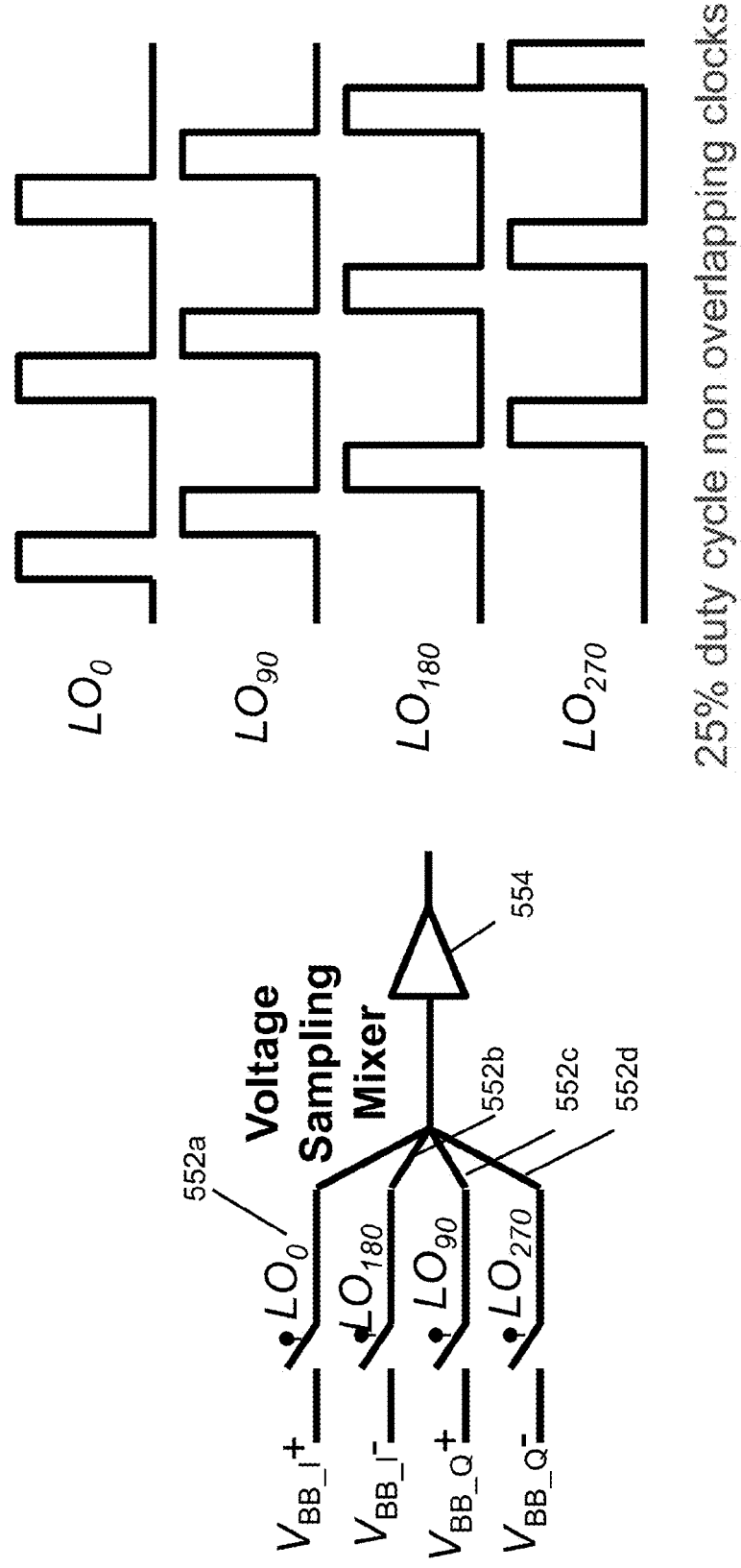

HIGH LINEARITY MIXER USING A 33% DUTY CYCLE CLOCK FOR UNWANTED HARMONIC SUPPRESSION

CROSS-REFERENCE TO RELATED APPLICATION

This application claims benefit under 35 USC 119(e) of U.S. Provisional Patent Application No. 61/617,726, filed on Mar. 30, 2012, which is incorporated herein by reference in its entirety.

FIELD OF THE INVENTION

The present invention relates generally to integrated circuits and more specifically to a mixer utilized in such circuits.

BACKGROUND

Mixer circuits are utilized in a variety of types of integrated circuits to combine signals in many electronic applications. For consumer electronics applications it is always desirable to minimize the mixer circuit cost as well as improve the circuits overall efficiency. It is known that in certain circumstances when the utilizing such circuits there are undesired spurs or signals that are produced that can affect the overall performance of the mixer.

FIG. 1 is a diagram a mixer circuit 100 that may produce these undesirable spurs or signals environment. As is seen, the circuit 100 includes a mixer 102 which is coupled to a power amplifier (PA) driver 104. The PA driver 104 is in turn coupled to a power amplifier (PA) 106. As seen a baseband (BB) signal is provided to the mixer 102 in conjunction with the local oscillator (LO) signal to provide an output signal of $f_{LO}+f_{BB}$.

As is seen there is also an undesired spur at $f_{LO}-3f_{BB}$. This undesired spur can become an issue when transmitting data in certain frequency bands under certain standards. For example, under the Long Term Evolution (LTE) telecommunication standard, the LTE band 13 operation can be affected by these spurs as they can fall in the public safety band. Accordingly, it is desirable to remove the inter-modulation signal shown as IM3 to ensure proper operation of a device that utilizes a mixer circuit. It is known that the IM3 signal can be removed in a variety of ways. One way to address this issue is to couple a band pass filter 202 between the mixer 102' and the PA driver 104' as shown in FIG. 2. This does reduce the IM3 signal however at a cost of complexity and increased cost because the band pass filter 202 adds to the overall size of the circuit and can significantly increase the chip area and power consumption.

Another way to address this issue is to couple a saw filter 302 between the PA driver 104" and the PA 106" as shown in FIG. 3. In this solution, as is seen the saw filter 302 also removes or reduces the undesired spur. However the addition of the saw filter 302 requires more packaging area and is relatively more expensive and power consumption.

Another way to address this issue is to replace the mixer 102 with an active harmonic rejection mixer (HRM) 402 as shown in FIG. 4. Although the active HRM 402 does not have the problems associated with the other solutions above it still has problems in certain environments. To describe these issues in more detail refer now to the following description in conjunction with the accompanying figures.

FIG. 5A is a circuit schematic of a conventional active harmonic rejection mixer 500. The active harmonic rejection mixer 500 includes three mixer elements 502, 504 and 506 coupled in parallel. Each of the mixer elements 502, 504 and 506 each received differential input signals. Each of the mixer elements 502-506 transmits signals with different phases such that the vector sum of the undesirable harmonics (in this example, the $3^{rd}$ and the $5^{th}$) is zero. Mixer element 502 receives an in phase LO signal. Mixer element 504 receives a LO signal that is 45° out of phase with the signals received at mixer element 502. Mixer element 506 receives a LO signal that is 90° out of phase with the signal received at mixer element 502. In this circuit 500, the even order harmonics are rejected due to the differential operation of the circuit. The third and fifth harmonics as illustrated in FIG. 5B are cancelled by the output vectors of the mixer paths and by sizing the transistors in the mixer elements 502-506 in an appropriate manner. Accordingly, the signal for the fundamental harmonic is unattenuated. By contrast the third order harmonic and the fifth order harmonic signals are zero. For example as is seen, the transistors in mixer element 504 are larger than in the mixer elements 502 and 506.

The system requires unwanted signal (harmonics) subtraction, cancellation or rejection of multi-paths. In this type of system, a mismatch in multi-paths (X1, X2 and X3) results in residual error in subtraction, and sets a rejection limitation. Accordingly, the problem with the active HRM 500 is that it has limited linearity, requires high-power and utilizes a large area.

Another type of conventional mixer is a passive voltage sampling mixer. FIG. 5C is a diagram of a conventional passive voltage sampling mixer 550. The mixer 550 includes receives differential I and Q signals at their inputs 552a-552d. In this embodiment, the differential I signals 552a and 552b are separated by 180° and the differential Q signals 552c and 552d are separated by 180°. The outputs of the signals are coupled to an amplifier 554. The LO clocks 552a-552d are non-overlapping and are provided utilizing a 25% duty cycle as shown in FIG. 5D. The circuit 550 does have high linearity, has negligible power consumption and utilizes a small area on a chip or package; however it still has the undesirable spur component.

Accordingly, what is desired is to provide a system and method that overcomes the above issues. The system should be simple, cost effective, easily implemented and adaptable to existing environments. The present invention addresses such a need.

SUMMARY OF THE INVENTION

A mixer circuit is disclosed. The mixer circuit comprises a plurality of mixer elements, wherein there are non-overlapping clock signals provided to the plurality of mixer elements which have a duty cycle of 33⅓ percent. Output signals of the mixer elements do not contain third order harmonic content of the non-overlapping clock signals. The I-Q quadrature image signal is suppressed by using a mixer which uses I-Q quadrature baseband inputs, 3-phase clock, voltage sampling on non-overlapping clocks and thereby achieves high linearity.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 5C is a diagram of a conventional passive voltage sampling mixer.

FIG. 5D illustrates the non-overlapping clock signals associated with the mixer of FIG. 5C.

DETAILED DESCRIPTION OF PREFERRED EMBODIMENTS

The present invention relates generally to integrated circuits and more specifically to a mixer utilized in such circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A method and system in accordance with the present invention eliminates undesired harmonic contents at 3fLO and fLO-3fBB in a straightforward manner. The elimination of the harmonic contents at 3fLO and fLO-3 fBB is accomplished via utilizing a sampling mixer which runs at a substantially 33⅓ percent (e.g., about 33%) duty cycle. In so doing, there is no harmonic content at 3fLO and hence the undesirable component at fLO-3fBB is eliminated. To describe the features of the present invention in more detail refer now to the following figures in conjunction with the accompanying drawings.

The system and method in accordance with the embodiments of the present invention has several advantages that are listed below.

1. Enable low noise for SAW-LESS system
2. Significantly reduced current consumption compared with existing solutions
3. Requires smaller chip area
4. Does not need digital compensation
5. Does not need any calibration (manufacturing, on-chip)
6. More robust over process and temperature.

To describe the features of the embodiments of the present invention in more detail refer now to the following figures in conjunction with the accompanying drawings.

Figure 1:
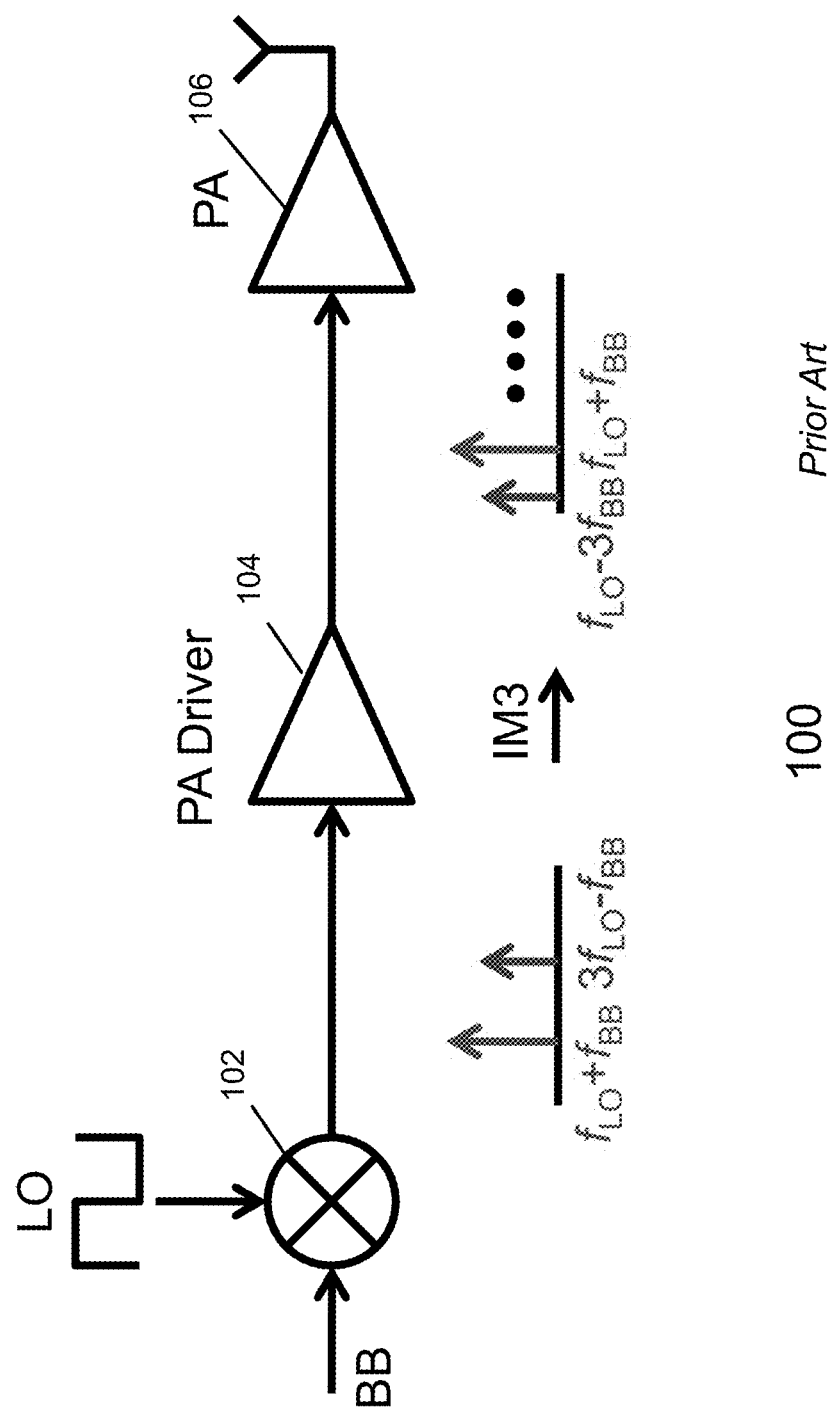
FIG. 1 is a diagram of a first embodiment of a conventional mixer circuit.
Figure 2:
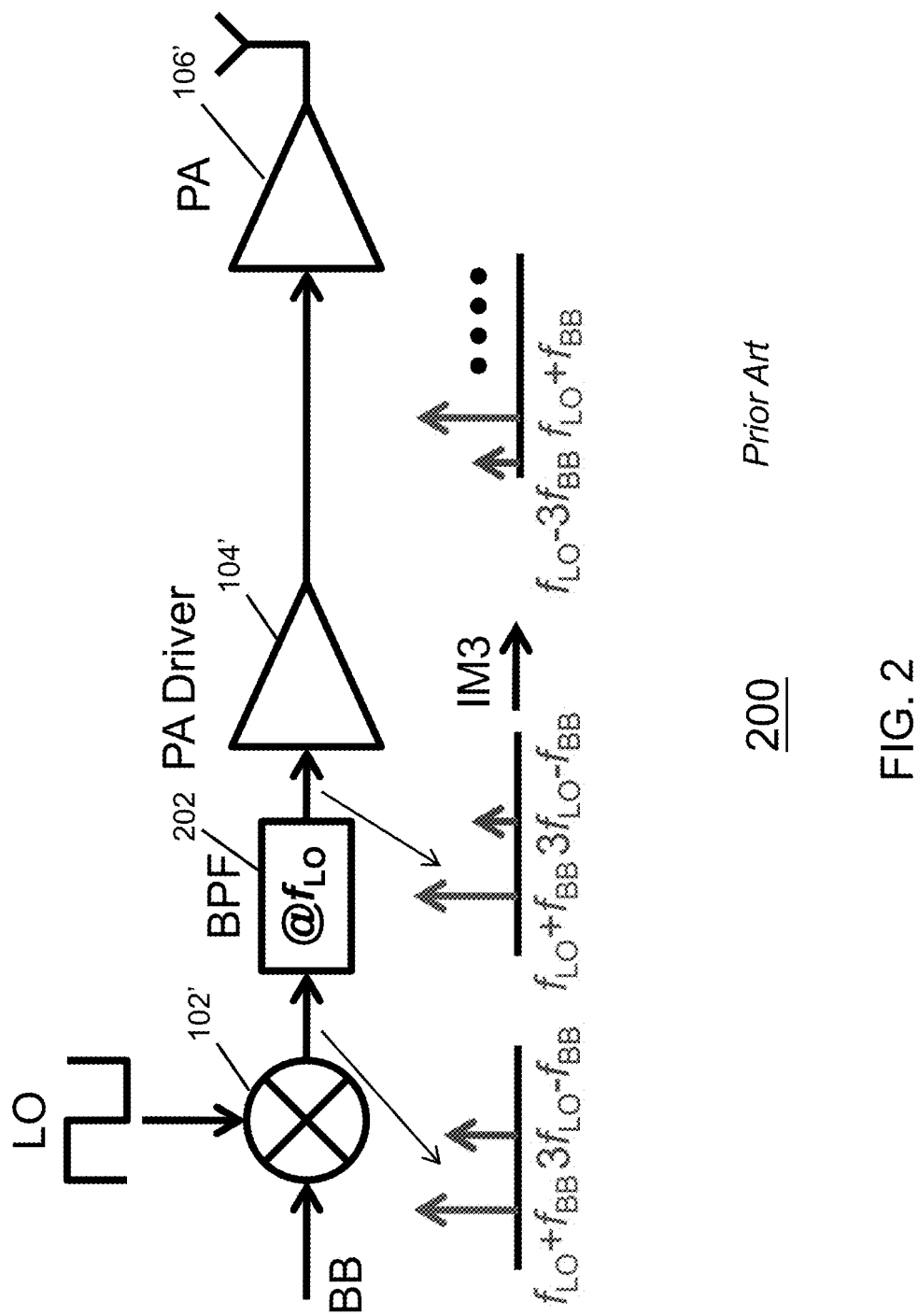
FIG. 2 is a diagram of a second embodiment of a conventional mixer circuit.
Figure 3:
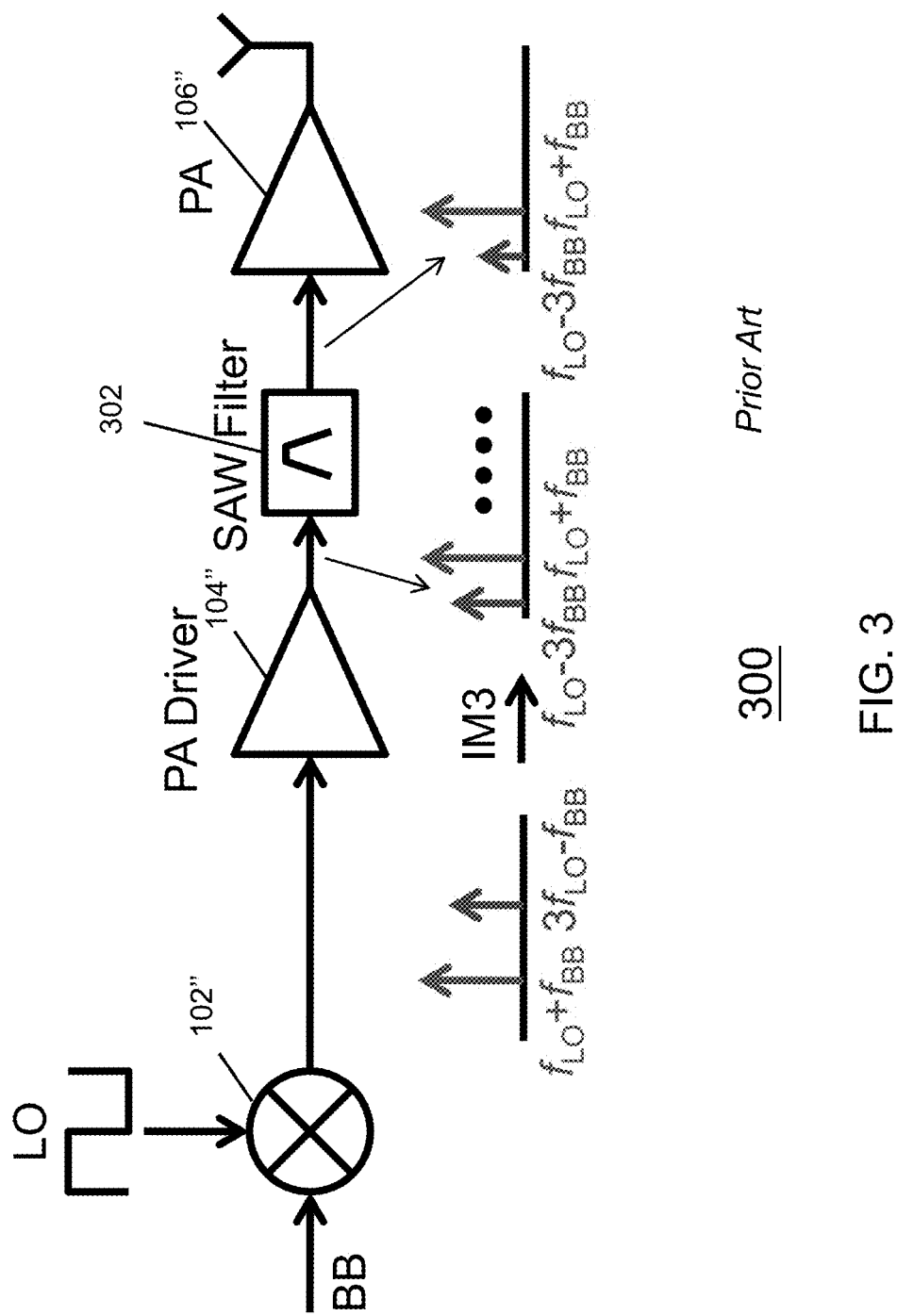
FIG. 3 is a diagram of a third embodiment of a conventional mixer circuit.
Figure 4:
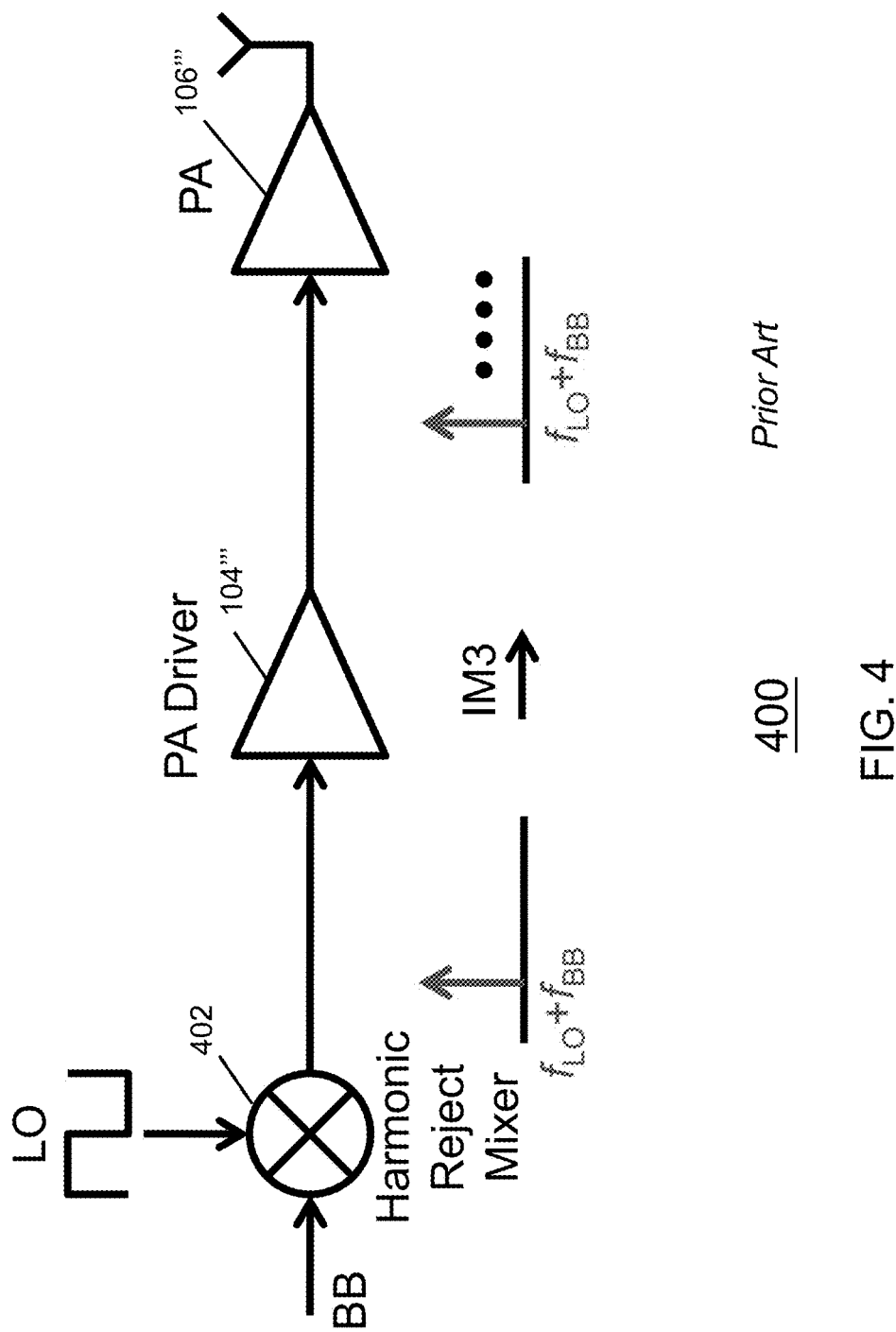
FIG. 4 is a diagram of a fourth embodiment of a conventional mixer circuit.
Figure 5A:
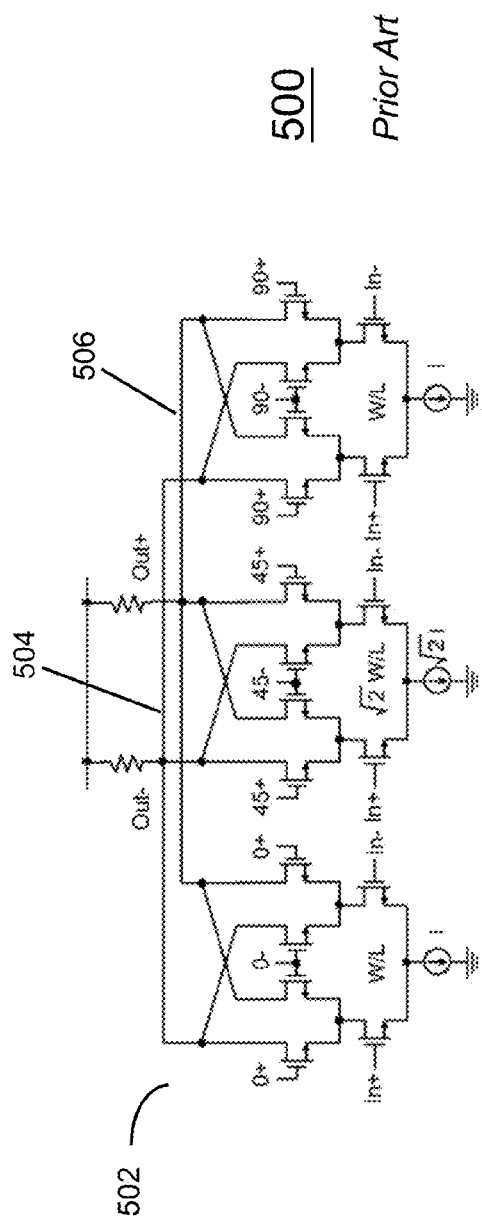
FIG. 5A is a circuit schematic of a conventional active harmonic rejection mixer.
Figure 5B:
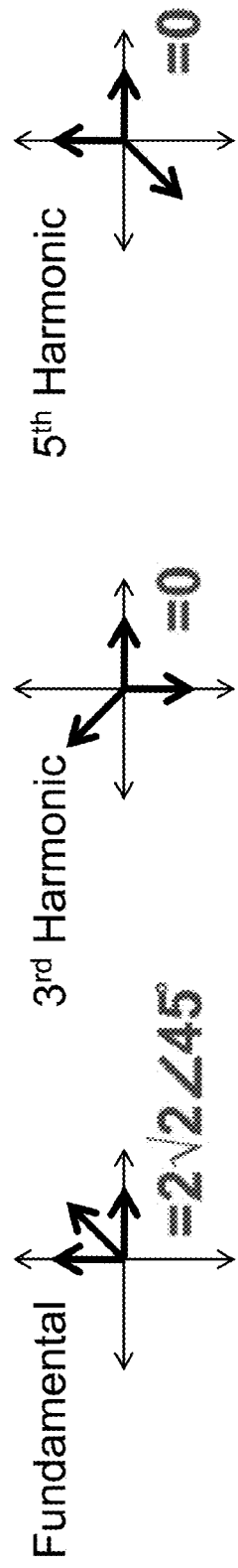
FIG. 5B illustrates the cancellation of the third and fifth order harmonics in the mixer of FIG. 5A.
Figure 6A:
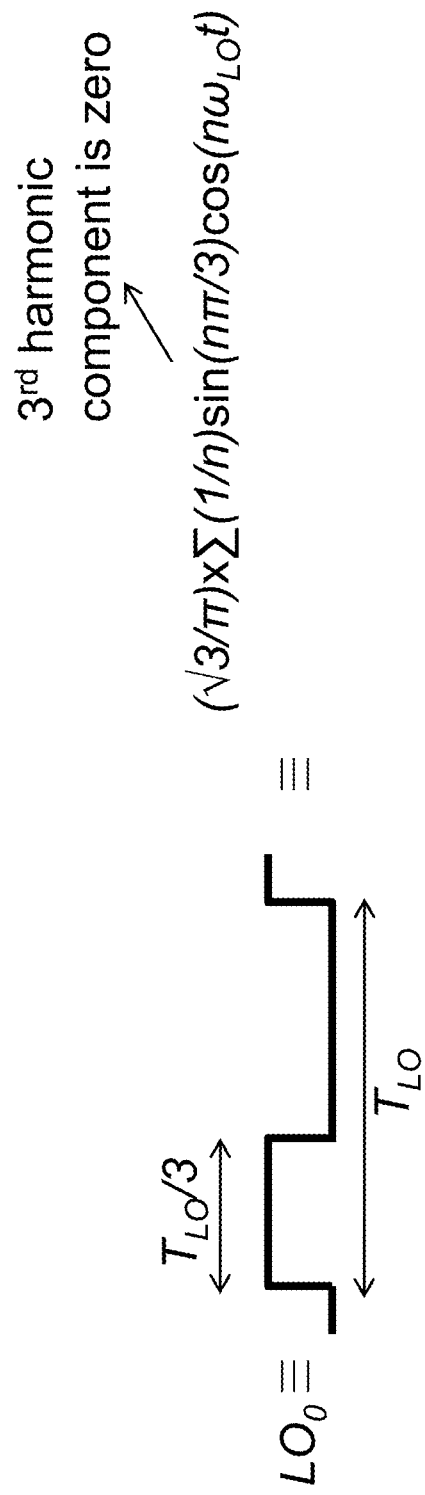
FIG. 6A is a diagram that illustrates that if a 33% duty cycle for the LO is utilized there is no third order harmonic component and its associate equation.
Figure 6B:
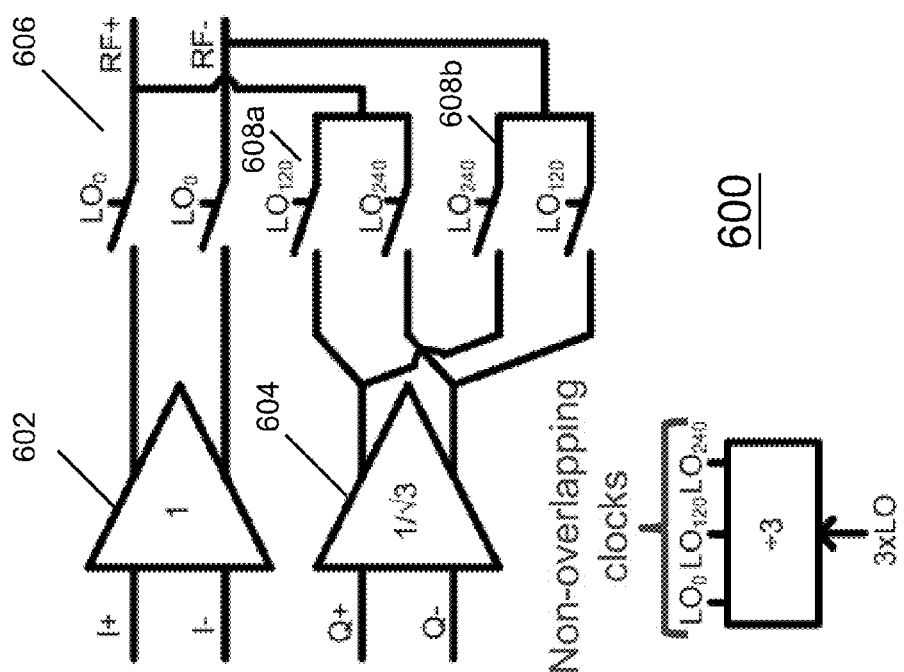
FIG. 6B is a diagram of a first embodiment of a mixer circuit in accordance with the present invention.
Figure 6C:
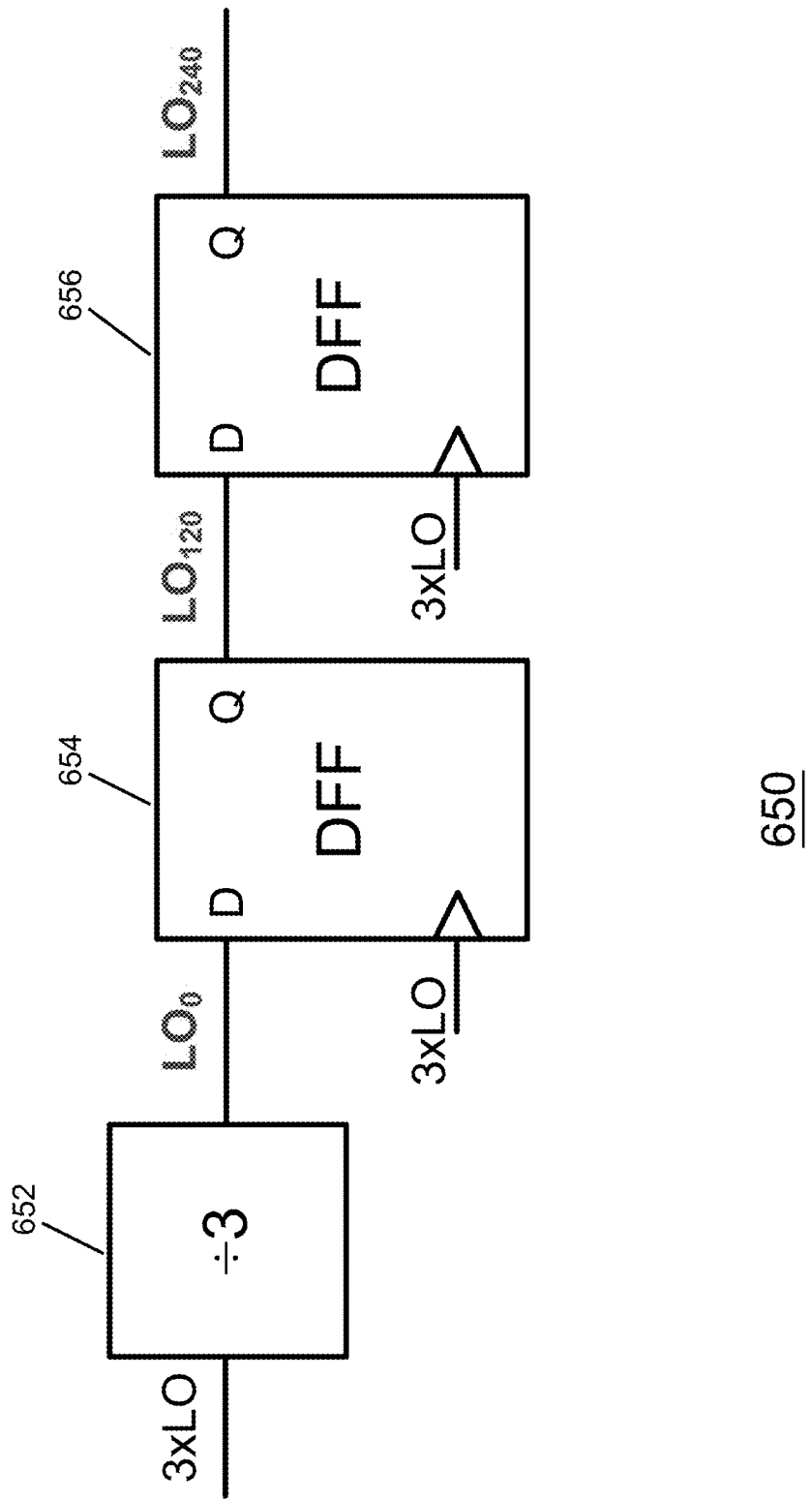
FIGS. 6C illustrates a three phase generation circuit in accordance with an embodiment.
Figure 6D:
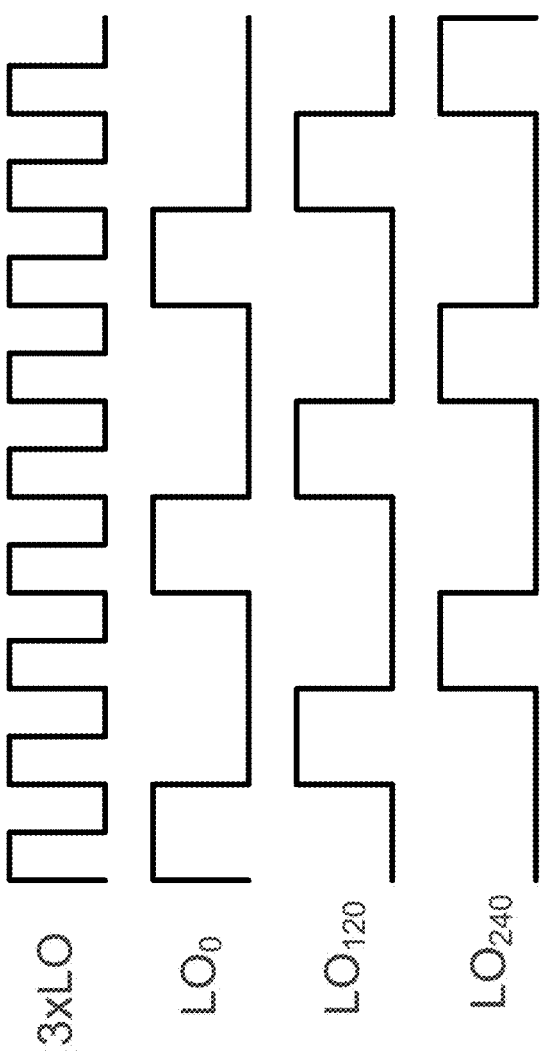
FIGS. 6D illustrates the waveforms associated with the three phase generation circuit of FIG. 6C.

FIG. 6A is a diagram that illustrates that if a 33% duty cycle for the LO is utilized there is no third order harmonic content and its multiple harmonic components and its associated equation. As is seen from the Figure a 33% duty cycle LO waveform does not have a third order harmonic component. Hence, it can be used this signal can be utilized by a voltage sampling mixer as illustrated in FIG. 6B to eliminate the third order harmonic (3fLO). FIG. 6B is a diagram of a first embodiment of a mixer circuit 600 in accordance with the present invention. As is seen the mixer circuit 600 includes first and second amplifiers 602 and 604 which receive differential I and Q inputs. The amplifiers 602 and 604 provide signals to the mixer the LO signal is provided into which comprises switches which are controlled by LO which is divided into three clocks at 0, 120 and 240 degrees as shown in FIG. 6D.

Accordingly a three phase mixer is provided in this embodiment to eliminate the undesired harmonic contents at 3fLO, fLO-3fBB and I-Q quadrature image signal of a signal. With this type of circuit the undesired harmonic contents at 3fLO and fLO-3fBB is eliminated. Furthermore the mixer 600 has higher overall gain as Q doesn't have to be scaled down by 1/sqrt(3).

The clocks can be generated in a variety of ways. FIGS. 6C illustrates a three phase generation circuit 650 that comprises conventional D flip-flops 654 and coupled to a divide by three LO 652 that are coupled in series. As is seen, the output signal from the LO 652 is an input to the flip flop 654 and the output signal from the flip flop 654 is an input to the flip flop 656. Therefore LO 652 provides the LO0 signal, flip flop 654 provides the L0120 signal and flip flop 656 provides the LO240 signal.

Referring back to FIG. 6B, the I amplifier 602 has a gain of 1 and the Q amplifier 604 has a gain of 1 divide the square root of 3. The I amplifier 602 is driving one set of differential switches 606 and the Q amplifier 604 is driving two sets of differential switches 608a and 608b. Therefore I and Q amplifiers are not balanced. This is not desirable because (a) I and Q paths are imbalanced resulting in worse I-Q image rejection; (b) LO signals are not differential and hence no second harmonic rejection at 2fLO. To address this issue it is important to provide symmetry between the two drivers.

Figure 7:
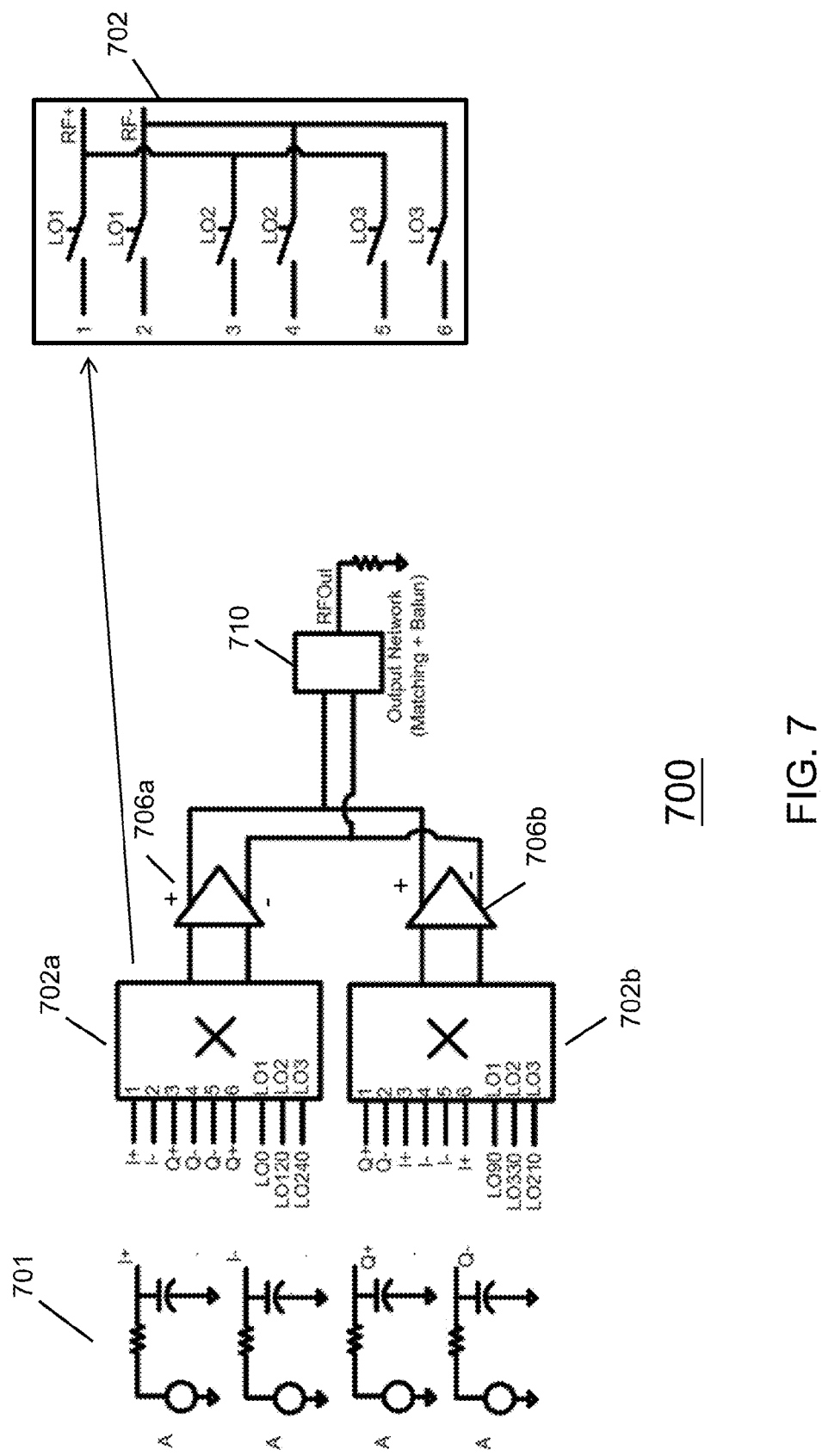
FIG. 7 is a diagram of a first embodiment of a symmetric voltage sampling mixer circuit in accordance with the present invention.

FIG. 7 is a diagram of a first embodiment of a symmetric voltage sampling mixer circuit in accordance with the present invention. The sampling mixer circuit 700 includes first and second passive mixer elements 702a and 702b. Mixer element 702a includes one pair of differential I inputs and two pairs of differential Q inputs while mixer element 702b includes one pair of differential Q inputs and two pairs of differential I inputs. Therefore the inputs on the two mixer elements are balanced. The outputs of the mixer elements 702a and 702b are coupled to drivers 706a and 706b respectively. The outputs of drivers 706a and 706b are coupled to an output network 710 in which the differential outputs of the drivers 706a and 706b are constructively added together. Mathematically, let the positive output to be denoted as +vo, and the negative output to be denoted as −vo. The 710 output will be +vo−(−vo)=2vo. That is, the positive differential outputs are coupled together and the negative differential outputs are coupled together.

As is seen, each of the mixer elements 702a and 702b comprise three pairs of differential switches that are driven by three non-overlapping LO (LO1, LO2 and LO3) clocks which are at a 33 ⅓ duty cycle. Accordingly a six phase mixer is provided in this embodiment to eliminate the undesired harmonic contents at 3fLO, fLO-3fBB and I-Q quadrature image signal of a signal. With this type of circuit the undesired harmonic contents at 3fLO and fLO-3fBB are eliminated and the circuit is balanced for the baseband signals (LO is still not balanced). Furthermore the mixer 700 has higher overall gain as Q doesn't have to be scaled down by 1/sqrt(3).

Although this mixer operates effectively to remove the undesired harmonic contents at 3fLO and fLO-3fBB and I-Q quadrature image signal it does not effectively remove second order (2fLO) harmonic content. Accordingly what is needed is a mixer that minimizes all harmonic contents described above.

Figure 8:
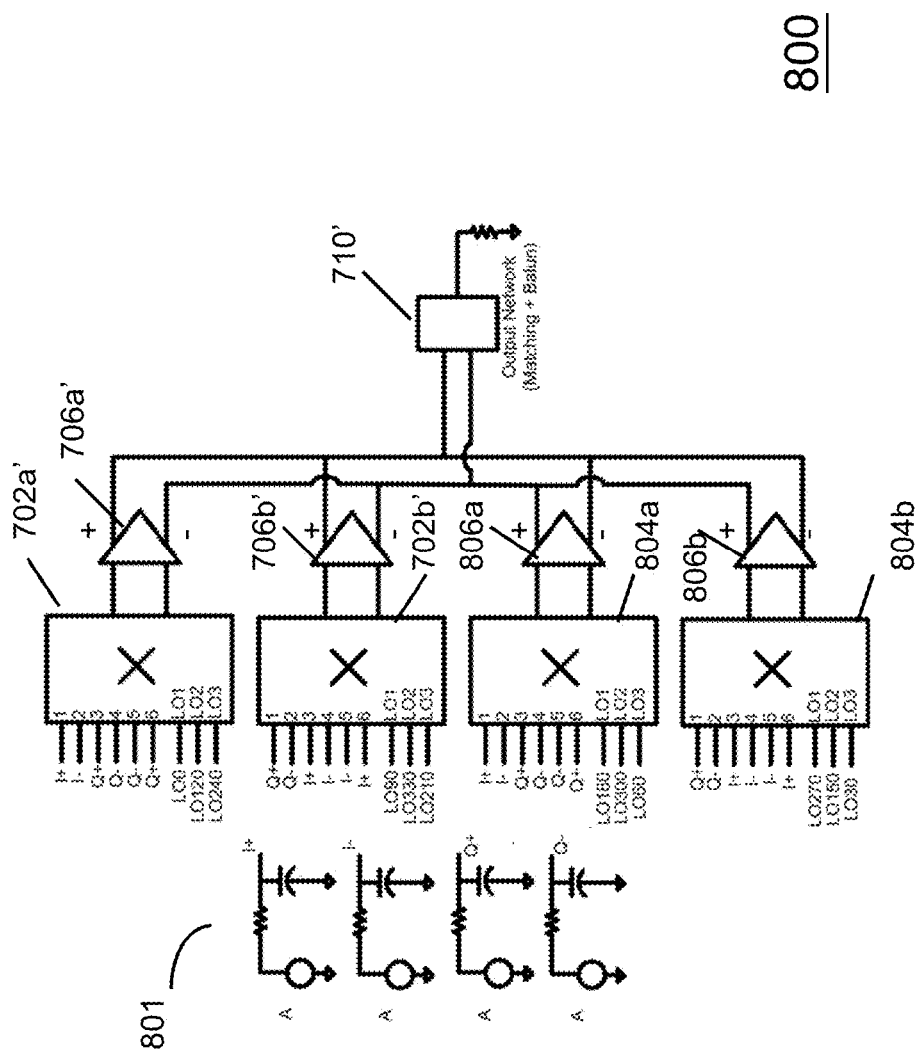
FIG. 8 is a diagram of a second embodiment of a symmetric voltage sampling mixer circuit in accordance with the present invention.

FIG. 8 is a diagram of an embodiment of a symmetric voltage sampling mixer circuit in accordance with the present invention that minimizes both the 2fLO harmonic contents and third 3fLO and hence LO-3fBB harmonic contents. Mixer circuit 800 includes the same topology as described in FIG. 7 but also includes two more mixer elements 804a and 804b. Mixer element 804a includes one pair of differential I inputs and two pairs of differential Q inputs while mixer element 804b includes one pair of differential Q inputs and two pairs of differential I inputs. Therefore the baseband inputs on the two mixer elements 804a and 804b are also balanced. The outputs of the mixer elements 804a and 804b are coupled to drivers 806a and 806b respectively to provide two differential outputs. The differential outputs of drivers 806a and 806b are coupled to an output network 710'. As is seen, each of the mixer elements 804a and 804b comprise three pairs of differential switches that are also driven by three non-overlapping LO (LO1, LO2 and LO3) clocks which are at a 33 ⅓ duty cycle and which are 180 degrees out of phase with the LO clocks of the mixer elements 702a and mixer element 702b respectively. The differential outputs of the drivers 706a, 706b, 806a and 806b are coupled together in a manner such that the fundamentals harmonic (at fLO) are constructively added, while the even order harmonics (2*N*fLO, N=1,2,3 . . . ) are subtracted from each other. For example referring to the outputs of driver 706a and driver 806a, the positive output signal from driver 706a is coupled to the negative output signal of 806a. By using this topology the even order harmonic output of the drivers 806a and 806b cancels the even order harmonic LO output of the drivers 706a and 706b, respectively.

In so doing a mixer is provided that has no third order and even order harmonics. The drivers 706a', 706b', 806a, and 806b also provide for reverse isolation if passive mixer elements are utilized to ensure accurate performance of the mixer circuit 800.

Accordingly, a low power, small area, and high linearity voltage sampling mixer is proposed which does not have harmonic contents at 3fLO and fLO-3fBB. The harmonic contents at 3fLO and fLO-3fBB of the mixer is eliminated by using a three phase mixer which uses voltage sampling on non-overlapping clocks and thereby achieving high linearity. A 12 phase LO can be used to make baseband I-Q and LO symmetric and differential.

Figure 9:
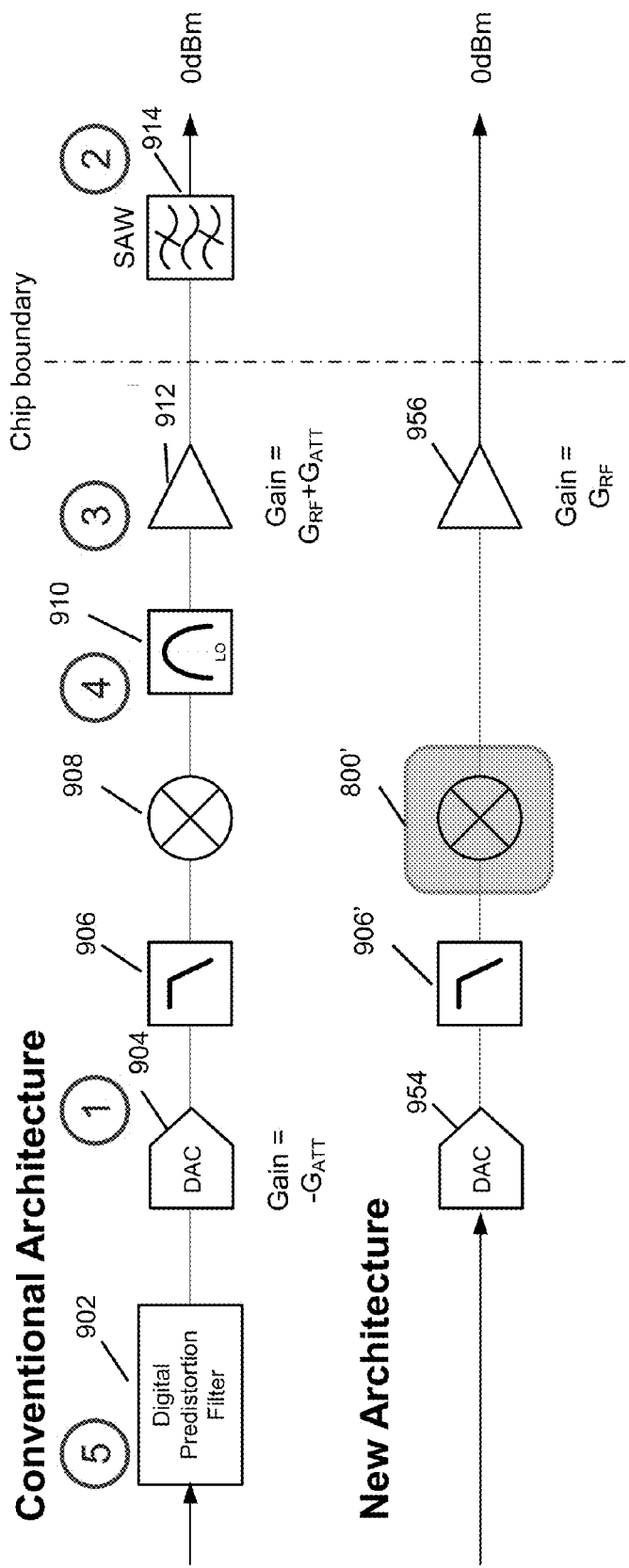
FIG. 9 is a diagram that compares a system that utilizes a mixer circuit in accordance with the present invention with a system that utilizes an active harmonic rejection mixer circuit.

To describe the advantages of this mixer in a particular environment refer now to the following description in conjunction with the accompanying figure. FIG. 9 is a diagram that compares a system that utilizes a mixer circuit in accordance with the present invention with a system that utilizes an active harmonic rejection mixer circuit. The environment is LTE band 13 which requires that the harmonic contents at fLO-3fBB be suppressed to an extremely low level. In the conventional architecture there are several issues that need to be addressed to allow for adequate performance which will be described in detail hereinbelow.

1. To improve LO-3$f_{BB}$ spur reduction for Band 13, signal reduction is required before the mixer 908, and extra gain is required after the mixer 908. This degrades noise performance.

2. Because of (1), an external SAW filter 914 is required to filter noise for RX de-sensitization.

3. To recover the signal reduction due to (1), and insertion loss due to (2), the RF amplifier requires higher power consumption (typical 2X the current). Therefore an extra gain stage is usually required, resulting in larger area.

4. To meet with Band 13 LO-3$f_{BB}$ spur, extra RF filtering 910 is required to reduce f3LO at the mixer output, hence reducing intermediation (IM3) product between desired signal and 3LO in the RF amplifier 912. This filter 910 is usually LC based to achieve the required filter. Therefore an inductor is required, that also results in larger area.

5. Extra digital compensation 902 is required to suppress the Band 3 LO-3$f_{BB}$ spur. Since the spur level is very low, on-chip calibration is prone to error. Manufacturing calibration is usually required. Furthermore, the Band 13 LO-3$f_{BB}$ spur is temperature sensitive, limiting the performance of digital compensation.

6. Without the invention, all (1) to (5) have to be employed simultaneously to meet the Band 13 LO-3$f_{BB}$ requirement wherein the new architecture does not need any of these elements.

Accordingly, a low power, small area, and high linearity voltage sampling mixer is proposed which does not have third harmonic (3fLO) output. The I-Q quadrature image signal is eliminated by using a three phase mixer which uses voltage sampling on non-overlapping clocks and thereby achieving high linearity. A 12 phase LO can be used to make I and Q symmetric and differential.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A mixer circuit comprising:
a plurality of mixer elements, wherein all clock signals to the plurality of mixer elements are fully non-overlapping with one another, wherein the non-overlapping clock signals are provided to the plurality of mixer elements have a duty cycle of 33⅓ percent; and
wherein output differential signals of the mixer elements do not contain third order harmonic content of the non-overlapping clock signals.

2. The mixer circuit of claim 1, wherein IQ inputs to one of the plurality of mixer elements are symmetric with that to another of the mixer elements.

3. The mixer circuit of claim 1, wherein the plurality of mixer elements are passive mixers.

4. The mixer circuit of claim 1, wherein the plurality of mixer elements comprises sets of differential switches.

5. The mixer circuit of claim 1, wherein the mixer elements comprises:
one pair of differential in-phase inputs for driving one pair of differential output signals by one pair of the non-overlapping clock signals; and two pairs of differential quadrature inputs for driving two pairs of differential output signals by two pairs of the non-overlapping clock signals, respectively;

wherein polarities and phases of the one pair of differential in-phase inputs and two pairs of differential quadrature inputs are configured such that unwanted image signals are suppressed at an output of the mixer circuit.

6. The mixer circuit of claim 5, further comprising:

a plurality of scaling amplifiers for scaling amplitudes of the one pair of differential in-phase inputs and two pairs of differential quadrature inputs before the mixer elements.

7. The mixer circuit of claim 1, wherein the non-overlapping clock signals are provided by a divide-by-3 phase generation circuit.

8. The mixer circuit of claim 1, wherein the mixer elements comprises a first mixer element comprising one pair of differential in-phase inputs for driving one pair of differential output signals and two pairs of differential quadrature inputs for driving two pairs of differential output signals; and a second mixer element comprising one pair of differential quadrature inputs for driving one pair of differential output signals and two pairs of differential in-phase inputs for driving two pairs of differential output signals;

wherein polarities and phases of the differential in-phase inputs and quadrature inputs of the first and second mixers are configured such that unwanted image signals is suppressed at an output of the mixer circuit.

9. The mixer circuit of claim 8, further comprising:

first and second drivers coupled to the differential outputs of the first and second mixer elements to provide the differential output signals;

wherein positive outputs of the first and second drivers are combined and negative outputs of the first and second drivers are combined;

wherein the first and second drivers provide reverse isolation for the first and second mixer elements.

10. The mixer circuit of claim 8, further comprising:

a third mixer element comprising one pair of differential in-phase inputs for driving one pair of differential output signals and two pairs of differential quadrature inputs for driving two pairs of differential output signals; and a fourth mixer element comprising one pair of differential quadrature inputs for driving one pair of differential output signals and two pairs of differential in-phase inputs for driving two pairs of differential output signals;

wherein the polarities and the phases of the differential inputs and quadrature inputs of the third and fourth mixers are configured such that unwanted image signals and even order harmonics of the signals are suppressed at the output of the mixer circuit.

11. The mixer circuit of claim 10, further comprising:

first and second drivers coupled to the differential outputs of the first and second mixer elements, and third and fourth drivers coupled to differential outputs of the third and fourth mixer elements, respectively, to provide the differential output signals.

12. The mixer circuit of claim 11, wherein positive outputs of the first, second drivers, and negative outputs of the third and fourth drivers are combined so that the fundamental harmonic of the output signal is constructively added, while the second harmonic of the output signal is cancelled.

13. The mixer circuit of claim 11, wherein the first, second, third and fourth drivers provide reverse isolation for the first, second, third and fourth mixer elements.

14. A mixer circuit comprising:

a first mixer element, wherein all clock signals are fully non-overlapping with one another, wherein the plurality of non-overlapping clock signals are provided to the first mixer element which have a duty cycle of 33⅓ percent; and a signal combining device coupled to the first mixer element, arranged to combine outputs from the first mixer element wherein an output signal of the signal combining device do not contain third order harmonic content of the non-overlapping clock signals.

15. The mixer circuit of claim 14, further comprising at least one other mixer element coupled to the signal combining device, wherein a plurality of non-overlapping clock signals are provided to the at least one other mixer element which have a duty cycle of 33⅓ percent.

* * * * *